United States Patent
Arai (10) Patent No.: US 7,548,099 B2
(45) Date of Patent: *Jun. 16, 2009

(54) SEMICONDUCTOR DEVICE WITH DELAY SECTION

(75) Inventor: Minari Arai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 146 days.

This patent is subject to a terminal disclaimer.

(21) Appl. No.: 11/882,657

(22) Filed: Aug. 3, 2007

(65) Prior Publication Data

US 2007/0291559 A1    Dec. 20, 2007

Related U.S. Application Data

(62) Division of application No. 11/389,104, filed on Mar. 27, 2006, now Pat. No. 7,263,009.

(30) Foreign Application Priority Data

Mar. 25, 2005   (JP) .............................. 2005-089420

(51) Int. Cl.
    *H03L 7/00*   (2006.01)
(52) U.S. Cl. ...................... 327/160; 327/141; 327/172
(58) Field of Classification Search ................ 327/141, 327/151, 153
    See application file for complete search history.

(56) References Cited

U.S. PATENT DOCUMENTS

| | | | |
|---|---|---|---|
| 6,538,932 B2 | 3/2003 | Ellis et al. | |
| 6,819,190 B2 * | 11/2004 | Pearce et al. | 331/57 |
| 7,263,009 B2 * | 8/2007 | Arai | 365/194 |
| 2005/0231249 A1 * | 10/2005 | Tani | 327/158 |
| 2006/0227631 A1 * | 10/2006 | Arai | 365/194 |
| 2007/0176659 A1 * | 8/2007 | Gomm | 327/175 |

FOREIGN PATENT DOCUMENTS

| | | |
|---|---|---|
| JP | 8-274602 | 10/1996 |
| JP | 9-304484 | 11/1997 |
| JP | 2000-201058 | 7/2000 |
| JP | 2001-33529 | 2/2001 |
| JP | 2002-76858 | 3/2002 |
| JP | 2003-32104 | 1/2003 |

* cited by examiner

*Primary Examiner*—Long Nguyen
*Assistant Examiner*—Ryan C Jager
(74) *Attorney, Agent, or Firm*—Young & Thompson (57) ABSTRACT

In a semiconductor memory device, a reference delay section has a first delay value and delays a first signal by a reference delay value obtained from the first delay value and an adjustment value while changing the adjustment value, and fixes the adjustment value when the first signal and the delayed first signal meet a predetermined condition. A delay section has a second delay value and generates an output signal based on a summation of the fixed adjustment value and the second delay value, and a set multiplication value in response to a trigger signal such that the output signal in an active state for a period corresponding to the set multiplication value.

8 Claims, 9 Drawing Sheets

SEMICONDUCTOR DEVICE WITH DELAY SECTION

CROSS REFERENCE TO RELATED APPLICATION

This application is a division of U.S. application Ser. No. 11/389,104 filed on Mar. 27, 2006, which claimed priority under 35 USC 119 of earlier Japanese application 2005-089420 filed on Mar. 25, 2005. The entire contents of each of these earlier applications is hereby expressly incorporated by reference.

BACKGROUND OF THE INVENTION

1. Field of the Invention

The present invention relates to a semiconductor memory device, and in particular, relates to a semiconductor memory device capable of generating a delay signal.

2. Description of the Related Art

A semiconductor memory device is provided with a delay circuit. A delay amount by the delay circuit is determined through simulation at the time of designing. However, an actual delay amount by the delay circuit is different from the that of the delay circuit at the time of designing, due to diffusion conditions, in-plane variations in a wafer, and so on, at the time of manufacturing a semiconductor memory device.

It is desired to eliminate a difference between the delay amount of the delay circuit at the time of designing, and the actual delay value of the delay circuit.

By the way, Japanese Laid Open Patent Application (JP-P2000-201058A) discloses a semiconductor device. The semiconductor device of this conventional example is provided with a comparison delay circuit section, a reference delay circuit section, a delay time determining circuit section, and a delay adjustment circuit section. The comparison delay circuit section includes a delay circuit used to determine variations of delay time. The reference delay circuit section includes a delay circuit in which at least one given reference delay time is set as a reference value of delay time. The delay time determining circuit section determines the variations of delay time in the above comparison delay circuit section, based on the reference delay time of the reference delay circuit section. The delay adjustment circuit section having a plurality of delay circuits each having different sets delay time, selects one of the plurality of delay circuits in accordance with the determination result of the delay time determining circuit section, to delay a desired signal. Consequently, it is possible to determine the variations of delay time in the delay circuit caused by process variations and so on, and adjust the delay time in accordance with the variations.

Also, Japanese Laid Open Patent Application (JP-P2001-33529A) discloses a delay clock generating device for generating a delayed clock signal having a given delay amount. The delay clock generating device is provided with a period delay section, a half-period delay section, and a high-resolution delay section. The period delay section generates a delay amount corresponding to a reference clock period obtained by multiplying an integer number, the reference clock period being shorter than the given delay amount. The half-period delay section generates a delay amount of a half period of the reference clock signal. The high-resolution delay section adds a differential delay amount between the sum of delay amounts generated by the period delay section and the half-period delay section, and a given delay amount, to the delay amount generated by the period delay section and the half-period delay section. Consequently, it is possible to reduce a delay amount generated by the high-resolution delay section.

Also, Japanese Laid Open Patent Application (JP-P2002-76858A) discloses a timing signal generating circuit. The timing signal generating circuit of this conventional example is provided with a plurality of first delay elements, a first selecting section, a generating section, a second delay element, a detecting section, a comparing section, a specifying section, and a control section. The plurality of first delay elements are connected in series. The first selecting section selects one of the plurality of first delay signals outputted from the plurality of first delay elements. The generating section generates a timing signal based on the first delay signal selected by the first selecting section. The second delay element has the same delay characteristic as the first delay element. The detecting section detects N times (N is an integer number) of the delay time of the second delay element. The comparing section compares a detection time of the detecting section with a reference time. The specifying section specifies a value of the N where the detection time and the reference time are in a given relationship based on the comparing result of the detecting section. The control section controls the first selecting section to select the first delay signal that is relevant to a value specified by the specifying section. Consequently, it is possible to compensate a temperature dependency characteristic of a delay element.

Also, Japanese Laid Open Patent Application (JP-A-Heisei 8-274602) discloses a variable delay circuit. The variable delay circuit of this conventional example is provided with a plurality of buses formed by serial connecting an optional number of variable delay gates, a bus selecting section, a reference delay time generating section, a phase comparing section, and a control signal generating section. The bus selecting section selectively connects the plurality of buses and sets a given delay time. The reference delay time generating section is arranged closely to the plurality of buses, and is formed by serially connecting the variable delay gates, which are the same variable delay gates used for the plurality of buses, and delays a reference clock signal by one period. The phase comparing section performs phase comparison of the reference clock signal and a delay output of the reference delay time generating section. The control signal generating section converts an output of the phase comparing section into a delay time control signal of the variable delay gate. The variable delay circuit simultaneously controls the variable delay gates of the reference delay time generating section in response to the delay time control signal. Consequently, it is possible to automatically compensate a variation of delay time caused by manufacturing variations.

Also, Japanese Laid Open Patent Application (JP-P2003-32104A) discloses a DLL circuit. The DLL circuit of this conventional example is provided with a basic phase comparator, a delay circuit, and a delay control circuit. The basic phase comparator detects a basic phase difference of two input signals. The delay control circuit receives an output signal of the basic phase comparator to adjust a delay amount of the delay circuit. The DLL circuit provides at least one phase comparator for detecting another phase difference different from the basic phase difference, and changes a change amount of a delay amount in accordance with the basic phase difference. Consequently, it is possible to reduce a time during which delay amounts converge (locked) at a desired delay value.

Also, Japanese Laid Open Patent Application (JP-A-Heisei 9-304484) discloses a synchronous semiconductor memory device. The synchronous semiconductor memory device of this conventional example is provided with a reference delay circuit, a determining section, and a selecting section. The reference delay circuit receives an external synchronous signal, and outputs one or a plurality of delay signals for defining a delay design value. The determining section determines a position of a shift edge for defining a cycle time of the external synchronous signal, in comparison with a shift edge of one or a plurality of delay output signals of the reference delay circuit. The selecting section variably selects a delay value for delaying an internal clock signal in accordance with the magnitude relationship between an actual delay value and a design value of the delay circuit based on the determination result. The selecting section sets a delay value to shorter or longer side in accordance with the fact that a delay value of the reference delay circuit is larger or smaller than a design value, the delay value delaying the internal clock signal. Consequently, it is possible to automatically set a change in a delay value caused by process change at manufacturing, to an optimum value at the time of mode register setting of initial setting.

SUMMARY OF THE INVENTION

An object of the present invention is to provide a semiconductor memory device which can eliminates a difference between a delay value of a delay circuit at the time of designing and a delay value of an actual delay circuit.

Another object of the present invention is to provide a semiconductor memory device which can obtain a desired delay value.

In an aspect of the present invention, a semiconductor memory device includes a reference delay section having a first delay value and configured to delay a first signal by a reference delay value obtained from the first delay value and an adjustment value while changing the adjustment value, and to fix the adjustment value when the first signal and the delayed first signal meet a predetermined condition; and a delay section having a second delay value, and configured to generate an output signal based on a summation of the fixed adjustment value and the second delay value, and a set multiplication value in response to a trigger signal such that the output signal in an active state for a period corresponding to the set multiplication value.

Here, the predetermined condition may be coincidence of a phase of the first signal and a phase of the delayed first signal.

Also, the reference delay section may include a control pulse signal generating circuit configured to generate a clock pulse signal when the first signal and the delayed first signal do not meet the predetermined condition; and a counter circuit configured to count the clock pulse signal to change the adjustment value.

In this case, the control pulse signal generating circuit may stop the generation of the clock pulse signal when the first signal and the delayed first signal meet the predetermined condition, and the counter circuit may hold and fix the adjustment value when the clock pulse signal is not supplied from the control pulse signal generating circuit.

Also, the second delay value is same as the first delay value.

Also, the delay section may include a control circuit configured to hold the output signal to the active state in response to the trigger signal, and to reset the output signal to an inactive state when the summation of the fixed adjustment value and the second delay value is equal to the set multiplication value.

In this case, the delay section may include a delay circuit configured to delay the output signal by the summation of the fixed adjustment value and the second delay value; a delay counter configured to count a number of times of the delay by the delay circuit; and a coincidence detection circuit configured to generate a coincidence signal when detecting coincidence of a count value of the delay counter and the set multiplication value. The control circuit resets the output signal to the inactive state in response to the coincidence signal.

Also, the semiconductor memory device may further include a plurality of delay sections. The reference delay section outputs the fixed adjustment value to the plurality of delay sections, and the plurality of delay sections receives a plurality of set multiplication values which are different from each other.

Also, in another aspect of the present invention, a method of generating an output signal with a desired delay in a semiconductor memory device is achieved by delaying a first signal by a reference delay value obtained from a first delay value and an adjustment value while changing the adjustment value; by fixing the adjustment value when the first signal and the delayed first signal meet a predetermined condition; and by generating an output signal based on a summation of the fixed adjustment value and the second delay value, and a set multiplication value in response to a trigger signal such that the output signal in an active state for a period corresponding to the set multiplication value.

Also, the predetermined condition may be coincidence of a phase of the first signal and a phase of the delayed first signal.

Also, the delaying a first signal may be achieved by generating a clock pulse signal when the first signal and the delayed first signal do not meet the predetermined condition; and by counting the clock pulse signal to change the adjustment value.

In this case, the fixing may be achieved by stopping the generation of the clock pulse signal when the first signal and the delayed first signal meet the predetermined condition; and by holding and fixing the adjustment value when the clock pulse signal is not supplied from the control pulse signal generating circuit.

Also, the second delay value may be same as the first delay value.

Also, the generating an output signal may be achieved by holding the output signal to the active state in response to the trigger signal; and by resetting the output signal to an inactive state when the summation of the fixed adjustment value and the second delay value is equal to the set multiplication value.

Also, the generating an output signal may be achieved by further delaying the output signal by the summation of the fixed adjustment value and the second delay value; counting a number of times of the delay by the delay circuit; and generating a coincidence signal when detecting coincidence of a count value of the delay counter and the set multiplication value. The resetting is achieved by resetting the output signal to the inactive state in response to the coincidence signal.

Also, the delaying and the fixing are carried out in a single reference delay section, and the generating an output signal is carried out in each of a plurality of delay sections. The plurality of delay sections receives a plurality of set multiplication values which are different from each other.

BRIEF DESCRIPTION OF THE DRAWINGS

FIGS. 4A to 4K are timing charts showing an operation of the reference delay section;

FIGS. 5A to 5G are timing charts showing an operation of the delay section;

FIGS. 7A to 7G are timing charts showing an operation of a delay generating section DL0 in the semiconductor memory device in the second embodiment;

FIGS. 8A to 8G are timing charts showing an operation of a delay generating section DL1 in the semiconductor memory device in the second embodiment; and FIGS. 9A to 9G are timing charts showing an operation of a delay generating section DLs in the semiconductor memory device in the second embodiment.

DESCRIPTION OF THE PREFERRED EMBODIMENTS

Hereinafter, a semiconductor memory device of the present invention will be described in detail with reference to the attached drawings.

First Embodiment

Figure 1:
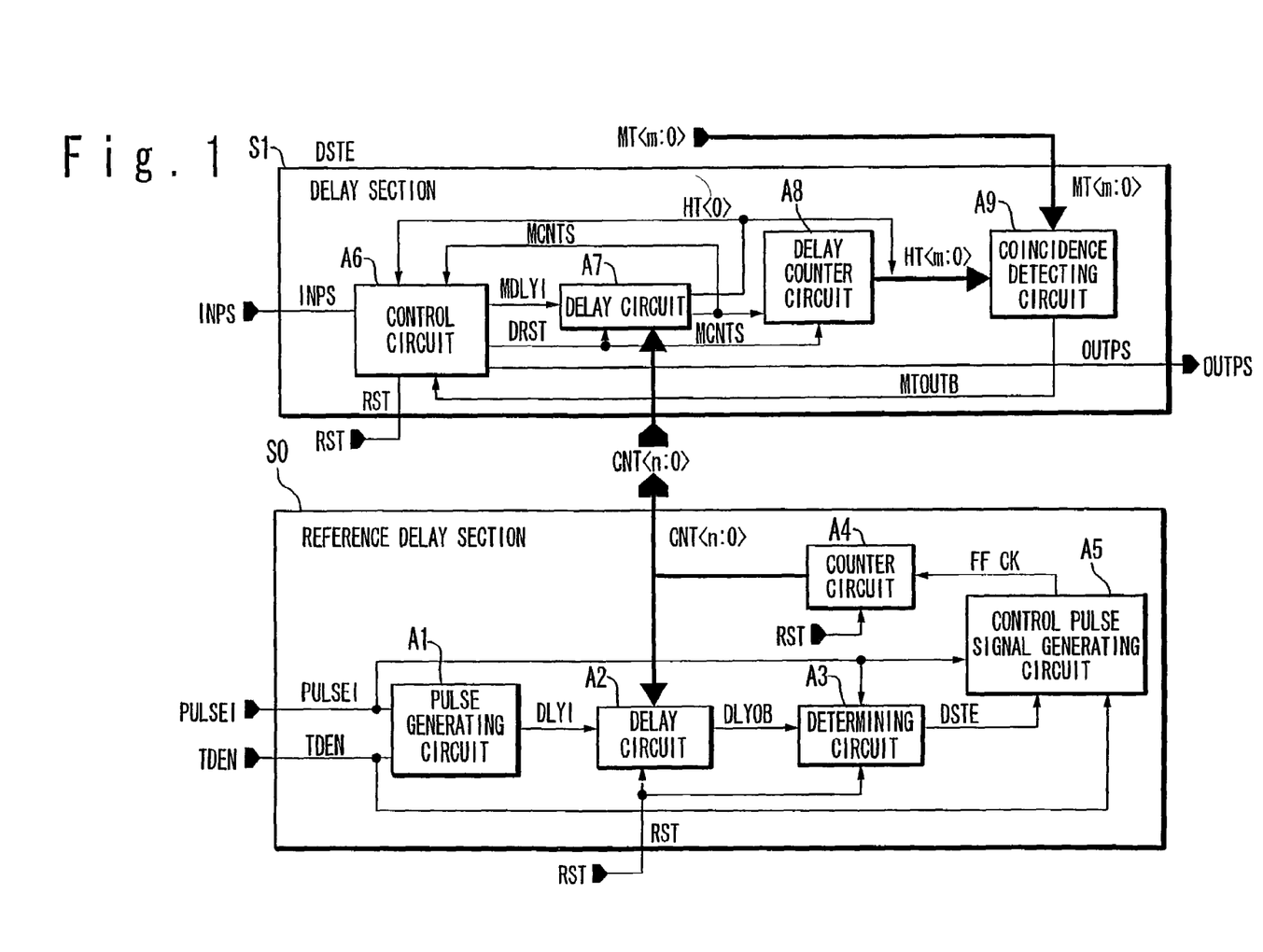
FIG. 1 is a block diagram showing the configuration of a semiconductor memory device according to a first embodiment of the present invention.

FIG. 1 is a block diagram showing a configuration of a semiconductor memory device according to the first embodiment of the present invention. Referring to FIG. 1, the semiconductor memory device in the first embodiment of the present invention has a reference delay section S0 and a delay section S1. The reference delay section S0 generates a reference delay value. The delay section S1 outputs an output signal OUTPS with a delay value m times (m is an integer number equal to or more than 1) of the reference delay value for a trigger signal INPS. The reference delay section S0 has a reference circuit pulse generating circuit A1, a delay circuit A2, a determining circuit A3, a counter circuit A4, and a counter circuit control pulse signal generating circuit A5. The delay section S1 has a delay circuit control circuit A6, a delay circuit A7, a delay counter circuit A8, and a coincidence detecting circuit A9. The delay circuit A7 has the same structure as the delay circuit A2.

The reference delay section S0 is further provided with a PULSEI terminal, a TDEN terminal, an RST terminal, and CNT<n:0> terminals. A pulse signal PULSEI is supplied to the PULSEI terminal from a high-performance tester and so on. The pulse width of the pulse signal PULSEI in an active state indicates a set delay value. An enable signal TDEN generated based on an external command is supplied externally to the TDEN terminal. A reset signal RST is supplied externally to the RST terminal. The CNT <n:0> terminals are connected to the delay section S1 through a bus. The delay circuit pulse generating circuit A1 receives the pulse signal PULSEI and the enable signal TDEN, and outputs an output signal DLYI to the delay circuit A2. If the pulse signal PULSEI is in the active state when the enable signal TDEN is supplied, the delay circuit pulse generating circuit A1 outputs the delay signal DLYI in the active state to the delay circuit A2.

The delay circuit A2 receives the output signal DLYI outputted from the delay circuit pulse generating circuit A1 and the bus signal CNT <n:0>, which is a count value outputted from the counter circuit A4, and outputs an output signal DLYOB to the determining circuit A3. The value "n" of the bus signal CNT <n:0> is determined based on an adjustment range and adjustment accuracy of the delay circuit A2. The value n is obtained by subtracting one from an exponent when a combination is expressed in an exponential form of 2. The delay circuit A2 resets an output signal DLYOB in response to the reset signal RST. The delay circuit A2 has a first delay value. The delay circuit A2 generates a second delay value based on the first delay value and an adjustment value which is indicated based on the bus signal CNT <n:0>, and delays the output signal DLYI based on the second delay value to output the output signal DLYOB.

The determining circuit A3 receives the output signal DLYOB from the delay circuit A2 and the pulse signal PULSEI, and outputs a determination resultant signal DSTE to the counter circuit control pulse signal generating circuit A5. The determining circuit A3 resets the determination resultant signal DSTE in response to the reset signal RST. The determining circuit A3 compares the second value and the set delay value in accordance with the pulse signal PULSEI and the signal DLYOB from the delay circuit A2. When the pulse width of the pulse signal PULSEI in the active state and a pulse width of the signal DLYOB in the active state are not coincident with each other, the determining circuit A3 outputs the comparison result DSTE to indicate non-coincidence between the second delay value and the set delay value. When the pulse width of the pulse signal PULSEI in the active state and the pulse width of the signal DLYOB in the active state are coincident with each other, the determining circuit A3 outputs the comparison result DSTE to indicate the coincidence between the second delay value and the set delay value.

The counter circuit control pulse signal generating circuit A5 receives the determination resultant signal DSTE outputted from the determining circuit A3, the pulse signal PULSEI, and the enable signal TDEN, and outputs a control pulse signal FFCK to the counter circuit A4. When the comparison result DSTE indicates the non-coincidence between the second delay value and the set delay value, the counter circuit control pulse signal generating circuit A5 outputs the control pulse signal FFCK in the active state. On the other hand, when the comparison result DSTE indicates the coincidence between the second delay value and the set delay value, the counter circuit control pulse signal generating circuit A5 outputs the control pulse signal FFCK in an inactive state, in order to fix the adjustment value by the bus signal CNT <n:0> outputted from the counter circuit A4.

The counter circuit A4 receives the control pulse signal FFCK outputted from the counter circuit control pulse signal generating circuit A5, and outputs the bus signal CNT <n:0> to the delay circuits A2 and A7. The bus signal CNT <n:0> is an adjustment count value for controlling the delay values of the delay circuits A2 and A7. The counter circuit A4 resets the count value in response to the reset signal RST. The counter circuit A4 retains the bus signal CNT <n:0> indicating the adjustment value. When the control pulse signal FFCK is in the active state, the counter circuit A4 increments the retained adjustment value by one, and outputs the bus signal CNT <n:0> indicating the incremented adjustment value. On the other hand, when the control pulse signal FFCK is in the inactive state, the counter circuit A4 regards the retained adjustment value as a fixed adjustment value, and outputs the bus signal CNT <n:0> to indicate the fixed adjustment value. When the adjustment value is fixed, the delay circuit A2 generates the reference delay value based on the first delay value and the adjustment value which is indicated based on the fixed bus signal CNT <n;0>, and delays the output signal DLYI based on the reference delay value to output the signal DLYOB. Consequently, in the semiconductor memory device of the present invention, it is possible to eliminate a difference between the delay value of the delay circuit at the time of designing and the delay value of the actual delay circuit by using the reference delay section S0, when the delay value of the actual delay circuit is different from the delay value of the delay circuit at the time of designing due to diffusion conditions, in-plane variations of a wafer, and so on at the time of manufacturing a semiconductor memory device.

The delay section S1 is further provided with an INPS terminal, an RST terminal, CNT <n:0> terminals, MT <m:0> terminals, and an OUTPS terminal. The delay request trigger signal INPS is supplied externally to the INPS terminal. The reset signal RST is supplied externally to the RST terminal. The CNT <n:0> terminals are connected to the reference delay section S0 through the bus.

The delay circuit control circuit A6 receives the trigger signal INPS, the reset signal RST, a bus signal HT<0> and an output signal MCNTS, which is an output signal outputted from the delay circuit A7, and a coincidence detection signal MTOUTB outputted from the coincidence detecting circuit A9. The delay circuit control circuit A6 outputs an output signal MDLYI to the delay circuit A7, a reset signal DRST to the delay circuit A7 and the delay counter circuit A8, and the output signal OUTPS. The output signal OUTPS is a pulse signal corresponding to a delay value obtained by multiplying the delay value of the delay circuit A7 by a constant value. The delay circuit control circuit A6 has a latch section. The latch section latches the output signal OUTPS in response to the trigger signal INPS. When the output signal OUTPS is latched and the bus signal HT<0> is in one of the active state and the inactive state, the delay circuit control circuit A6 outputs the output signal MDLYI in the other of the active state and the inactive state to the delay circuit A7.

The delay circuit A7 receives the output signal MDLYI outputted from the delay circuit control circuit A6, the reset signal DRST, and the bus signal CNT <n:0>, which is a count value outputted from the counter circuit A4. The delay circuit A7 outputs the output signal MCNTS to the delay circuit control circuit A6 and the delay counter circuit A8, and the bus signal HT<0>, which is one of the coincidence detection signals. The delay circuit A7 has a first delay value. The delay circuit A7 generates a reference delay value based on the first delay value and the adjustment value which is indicated based on the fixed bus signal CNT <n:0>, and delays the output signal MDLYI based on the reference delay value, to output the signal MCNTS as the output signal DLYOB, and the bus signal HT<0> as an inversion signal of the output signal DLYOB.

The delay counter circuit A8 receives the output signal MCNTS outputted from the delay circuit A7 and the reset signal DRST outputted from the delay circuit control circuit A6, and outputs a bus signal HT<m:1> to the coincidence detecting circuit A9. The delay counter circuit A8 is a counter circuit with a binary counter structure for counting the output signal MCNTS as a clock signal CLK, and outputs the count value as the bus signal HT<m:1> to the coincidence detecting circuit A9. The delay counter circuit A8 retains the output count value (HT<m:1>). When the output signal MCNTS changes from one of the active state and the inactive state to the other, the delay counter circuit A8 increments the retained output count value HT<m:1> by one, and outputs the bus signal HT<m:1> to indicate the output count value. A set bus signal MT<m:0> is supplied externally or internally to the MT<m:0> terminals to indicate a set multiplication value set in advance.

The coincidence detecting circuit A9 receives the bus signal HT<m:0> outputted from the delay circuit A7 and the delay counter circuit A8, and the set bus signal MT<m:0>, and outputs the coincidence detection signal MTOUTB of a low level when the bus signal HT<m:0> and the set bus signal MT<m:0> are coincident with each other. The value "m" in the bus signal HT<m:0> and the set bus signal MT<m:0> is the number of bits when the multiplication value indicating how many times of reference delay is necessary is binarized. The set multiple value by the set bus signal MT<m:0> indicates a delay value of m times of the reference delay value. The coincidence detecting circuit A9 outputs the coincidence detection signal MTOUTB to the delay circuit control circuit A6 when the output count value indicated by the bus signal HT<m:0> and the set multiple value indicated by the set bus signal MT<m:0> are coincident with each other. At this time, the delay circuit control circuit A6 outputs the output signal OUTPS latched by the latch section, in response to the coincidence detection signal MTOUTB. Thus, the output signal OUTPS is outputted to have a delay value of m times of the reference delay value in response to the trigger signal INPS.

In this way, the semiconductor memory device of the present invention can obtain a delay value of m times of the reference delay value as a desired delay value by using the delay section S1, since the reference delay value is generated by the above reference delay section S0.

Figure 2:
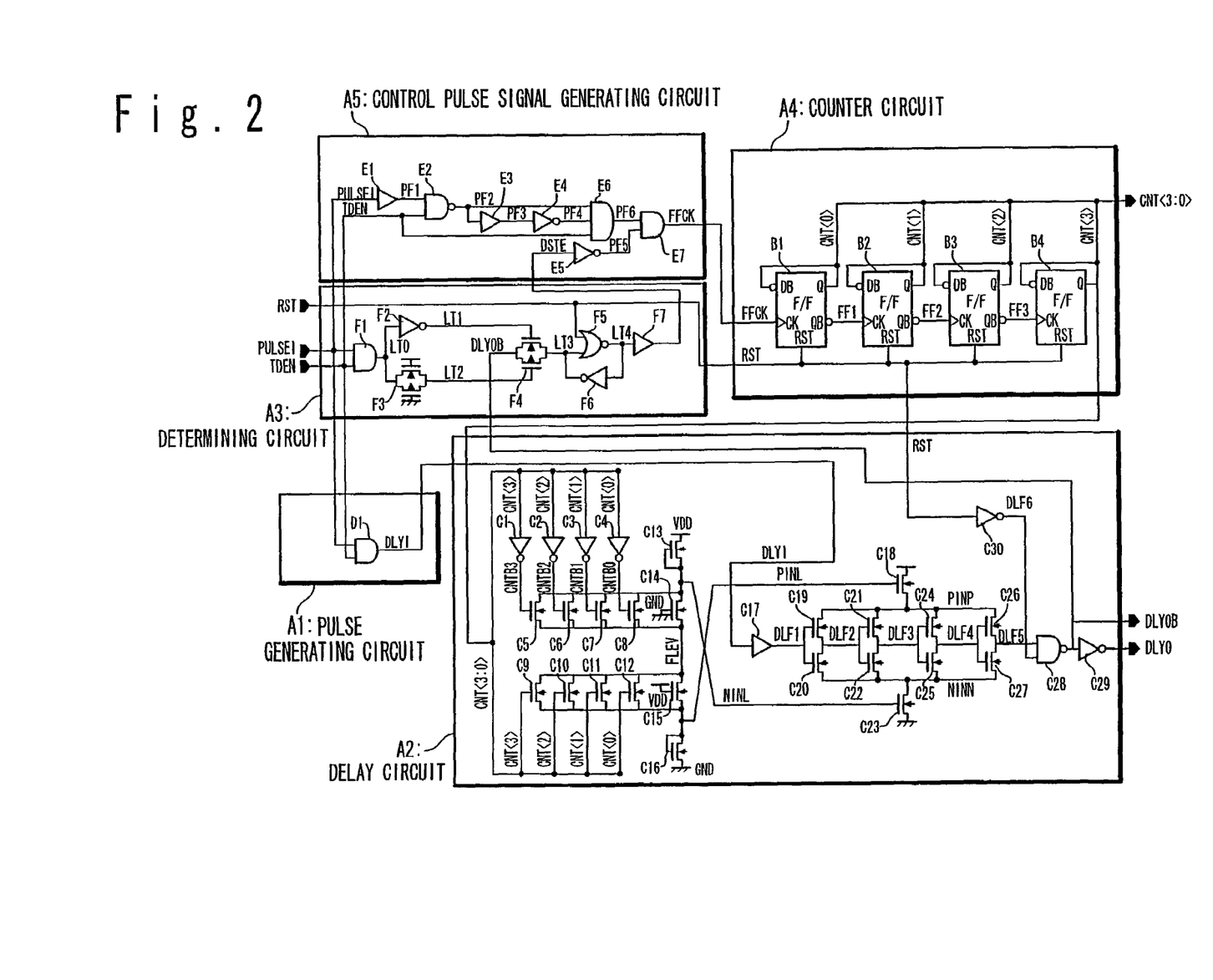
FIG. 2 is a circuit diagram showing the configuration of a reference delay section in the semiconductor memory device according to the first embodiment, when n is 3.

FIG. 2 is a circuit diagram showing a configuration of the reference delay circuit S0 when n is 3. The delay circuit pulse generating circuit A1 in the reference delay circuit S0 includes an AND circuit D1. The pulse signal PULSEI and the enable signal TDEN are supplied to the AND circuit D1. When both of the pulse signal PULSEI and the enable signal TDEN are in the high level, the AND circuit D1 outputs the output signal DLYI of the high level. Otherwise, the AND circuit D1 outputs the output signal DLYI of the low level "L".

The delay circuit A2 in the reference delay circuit S0 includes inverter circuits C1, C2, C3, C4, C29, and C30; PMOS transistors C5, C6, C7, C8, C13, C14, C18, C19, C21, C24, and C26; NMOS transistors C9, C10, C11, C12, C15, C16, C20, C22, C23, C25, and C27; a buffer circuit C17; and an NAND circuit C28. The inverter circuits C1, C2, C3, and C4 receive signals CNT<3>, CNT<2>, CNT<1>, and CNT<0> of the bus signal CNT<3:0> outputted from the counter circuit A4, and output signals CNTB3, CNTB2, CNTB1, and CNTB0 as inversion signals of the received signals CNT<3>, CNT<2>, CNT<1>, and CNT<0>, respectively. Each source of the PMOS transistors C5, C6, C7, and C8 receives a signal NINL. Drains of the PMOS transistors C5, C6, C7, and C8 output the signal NINL as a signal FLEV in accordance with the signals CNTB3, CNTB2, CNTB1, and CNTB0 supplied to the gates of the PMOS transistors. Drains of the NMOS transistors C9, C10, C11, and C12 receive the signal FLEV, respectively. Sources of the NMOS transistors C9, C10, C11, and C12 output the signal FLEV as a signal PINL in accordance with the signals CNT<3>, CNT<2>, CNT<1>, and CNT<0> supplied to the gates of the NMOS transistors C9, C10, C11, and C12, respectively. The source of the PMOS transistor C13 is supplied with a power supply voltage VDD, and the gate and drain thereof receive the above signal NINL. The gate of the PMOS transistor C14 is grounded (GND), the source thereof receives the above signal NINL, and the drain thereof outputs the signal NINL as the signal FLEV in accordance with the signal supplied to the gate. The gate of the NMOS transistor C15 is supplied with the power supply voltage VDD, the drain thereof is supplied with the above signal FLEV, and the source thereof outputs the above signal FLEV as the signal PINL in accordance with the signal supplied to the gate. The gate and drain of the NMOS transistor C16 are supplied with the above signal PINL, and the source thereof is grounded (GND).

The buffer circuit C17 receives the output signal DLYI, which is the output of the delay circuit pulse generating circuit A1, and outputs a signal DLFI. The source of the PMOS transistor C18 is supplied with the power supply voltage VDD, and the drain thereof outputs a signal PINP in accordance with the signal PINL supplied to the gate thereof. The source of the NMOS transistor C23 is grounded (GND), and the drain thereof is supplied with a signal NINN. The signal NINN supplied to the drain is outputted to the source in accordance with the signal NINL supplied to the gate thereof. The PMOS transistor C19 and the NMOS transistor C20 form an inverter (C19 and C20). The source of the PMOS transistor C19 is supplied with the signal PINP, and the source of the NMOS transistor C20 is supplied with the signal NINN. The inverter (C19 and C20) outputs a signal DLF2 in accordance with the signal DLF1 supplied to the input of the inverter. The PMOS transistor C21 and the NMOS transistor C22 form an inverter (C21 and C22). The source of the PMOS transistor C21 is supplied with the signal PINP, and the source of the NMOS transistor C22 is supplied with the signal NINN. The inverter (C21 and C22) outputs a signal DLF3 in accordance with the signal DLF2 supplied to the input. The PMOS transistor C24 and the NMOS transistor C25 form an inverter (C24 and C25). The source of the PMOS transistor C24 is supplied with the signal PINP, and the source of the NMOS transistor C25 is supplied with the signal NINN. The inverter (C24 and C25) outputs a signal DLF4 in accordance with the signal DLF3 supplied to the input. The PMOS transistor C26 and the NMOS transistor C27 form an inverter (C26 and C27). The source of the PMOS transistor C26 is supplied with the signal PINP, and the source of the NMOS transistor C27 is supplied with the signal NINN. The inverter (C26 and C27) outputs a signal DLF5 in accordance with the signal DLF 4 supplied to the input. The inverter circuit C30 receives the reset signal RST, and outputs a signal DLF6 as an inversion signal of the reset signal RST. The NAND circuit C28 is supplied with the signals DLF5 and DLF6. When both of the signals DLF5 and DLF6 are in the high level "H", the NAND circuit C28 outputs the output signal DLYOB of the low level "L" to the determining circuit A3. Otherwise, the NAND circuit C28 outputs the output signal DLYOB of the high level "H" to the determining circuit A3. The inverter circuit C29 receives the output signal DLYOB, and outputs a signal DLYO as an inversion signal.

The determining circuit A3 in the reference delay circuit S0 includes an AND circuit F1, inverter circuits F2 and F6, CMOS transfer gate circuits F3 and F4, an NOR circuit F5, and a buffer circuit F7. The AND circuit F1 is supplied with the above pulse signal PULSEI and the above enable signal TDEN. When both of the pulse signal PULSEI and the enable signal TDEN are in the high level "H", the AND circuit F1 outputs an output signal LT0 of the high level "H". Otherwise, the AND circuit F1 outputs the output signal LT0 of the low level "L". The inverter circuit F2 receives the signal LT0, and outputs a signal LT1. The CMOS transfer gate circuit F3 transfers the above signal LT0 to output a signal LT2. The CMOS transfer gate circuit F4 is controlled based on the signal LI1 and the signal LT2 and transfers the signal DLYOB to output as a signal LT3. When the signals LT1 and LT2 are the low level "L" and the high level "H", respectively, the CMOS transfer gate circuit F4 outputs the output signal DLYOB as the signal LT3. The NOR circuit F5 is supplied with the above reset signal RST and the signal LT3 from the transfer gate circuit F4. When either the reset signal RST or the signal LT3 is the low level "L", the NOR circuit F5 outputs a signal LT4 of the high level "H". Otherwise, the NOR circuit F5 outputs the signal LT4 of the low level "L". The inverter circuit F6 is supplied with the signal LT4, and outputs the signal LT3. The buffer circuit F7 is supplied with the signal LT4, and outputs a determination resultant signal DSTE to the counter circuit control pulse signal generating circuit A5.

The counter circuit control pulse signal generating circuit A5 in the reference delay circuit S0 includes a buffer circuit E1, a NAND circuit E2, inverter circuits E4 and E5, and AND circuits E6 and E7. The buffer circuit E1 is supplied with the above pulse signal PULSEI, and outputs a signal PF1. The NAND circuit E2 is supplied with the signal PF1 and the above enable signal TDEN. When both of the signal PF1 and the enable signal TDEN are in the high level "H", the NAND circuit E2 outputs a signal PF2 of the low level "L". Otherwise, the NAND circuit E2 outputs the signal PF2 of the high level "H". The buffer circuit E3 is supplied with the signal PF2, and outputs a signal PF3. The inverter circuit E4 receives the signal PF3, and outputs a signal PF4. The inverter circuit E5 receives the determination resultant signal DSTE from the determining circuit A3, and outputs a signal PF5 as an inversion signal of the determination resultant signal DSTE. The AND circuit E6 is supplied with the signals PF2 and PF4 and the above enable signal TDEN. When all of the signals PF2 and PF4 and the enable signal TDEN are in the high level "H", the AND circuit E6 outputs a signal PF6 of the high level "H". Otherwise, the AND circuit E6 outputs the signal PF6 of the low level "L". The AND circuit E7 is supplied with the signals PF5 and PF6. When both of the signals PF5 and PF6 are in the high level "H", the AND circuit E7 outputs the control pulse signal FFCK of the high level "H". Otherwise, the AND circuit E7 outputs the control pulse signal FFCK of the low level "L".

The counter circuit A4 in the reference delay circuit S0 includes flip-flop circuits B1, B2, B3, and B4. Each of the flip-flop circuits B1, B2, B3, and B4 has an inversion data input terminal DB, a clock input terminal CK, output terminals Q and QB, and a reset terminal RST. The input terminal DB and the output terminal Q are connected. The terminal CK of the flip-flop circuit B1 is connected to the counter circuit control pulse signal generating circuit A5. The output terminals QB of the flip-flop circuits B1, B2, and B3 are connected to the terminals CK of the flip-flop circuits B2, B3, and B4 respectively. The terminal CK of the flip-flop circuit B1 is supplied with the control pulse signal FFCK from the counter circuit control pulse signal generating circuit A5. When the signal level of the above control pulse signal FFCK shifts to the high level "H", the flip-flop circuit B1 outputs a signal in phase with the signal DB supplied to the input terminal DB to the output terminal QB as a signal FF1. When the signal level of the above signal FF1 shifts to the high level "H", the flip-flop circuit B1 latches the DB data supplied to the input terminal DB, and outputs the bus signal CNT<0> of the bus signal CNT<3:0> to the output terminal Q. The terminal CK of the flip-flop circuit B2 is supplied with the output signal FF1 from the flip-flop circuit B1. When the signal level of the above output signal FF1 shifts to the high level "H", the flip-flop circuit B2 outputs a signal in phase with the signal DB supplied to the input terminal DB to the output terminal QB as a signal FF2. When the signal level of the above signal FF2 shifts to the high level "H", the flip-flop circuit B2 latches the DB data supplied to the input terminal DB, and outputs the bus signal CNT<1> of the bus signal CNT<3:0> to the output terminal Q. The terminal CK of the flip-flop circuit B3 is supplied with the output signal FF2 from the flip-flop circuit B2. When the signal level of the above output signal FF2 shifts to the high level "H", the flip-flop circuit B3 outputs a signal in phase with the signal DB supplied to the input terminal DB to the output terminal QB as a signal FF3. When the signal level of the above signal FF3 shifts to the high level "H", the flip-flop circuit B3 latches the DB data supplied to the input terminal DB, and outputs the bus signal CNT<2> among the bus signal CNT<3:0> to the output terminal Q. The terminal CK of the flip-flop circuit B4 is supplied with the output signal FF3 from the flip-flop circuit B3. When the signal level of the above output signal FF3 shifts to the high level "H", the flip-flop circuit B4 latches the DB data supplied to the input terminal DB, and outputs the bus signal CNT<3> among the bus signal CNT<3:0> to the output terminal Q. The flip-flop circuits B1, B2, B3, and B4 reset the output of the output terminals Q and QB when the reset terminals RST of the flip-flop circuits B1, B2, B3, and B4 receive the above reset signal RST.

Figure 3:
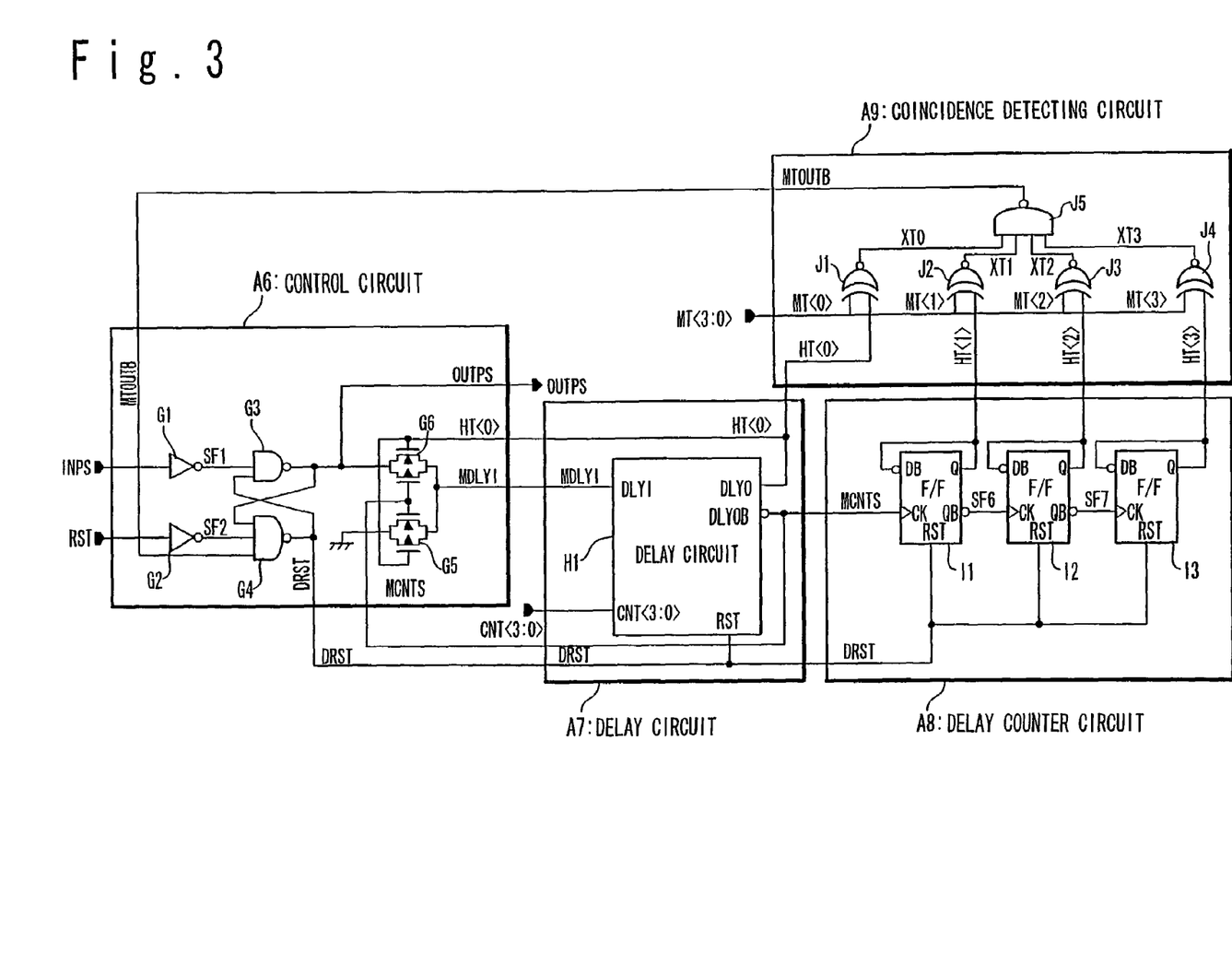
FIG. 3 is a circuit diagram showing the configuration of the delay section in the semiconductor memory device according to the first embodiment, when n is 3 and m is 3.

FIG. 3 is a circuit diagram showing a structure in the delay section S1 in case that n is 3 and m is 3.

The delay circuit control circuit A6 in the delay section S1 includes inverter circuits G1 and G2, NAND circuits G3 and G4, and CMOS transfer gate circuits G5 and G6. The inverter circuit G1 is supplied with the above trigger signal INPS, and outputs a signal SF1 as an inversion signal of the trigger signal INPS. The inverter circuit G2 receives the above reset signal RST, and outputs a signal SF2 as an inversion signal of the reset signal RST. The NAND circuits G3 and G4 form a latch section. The NAND circuit G3 is supplied with the signal SF1 and the reset signal DRST from the NAND circuit G4. When both of the signal SF1 and the reset signal DRST are in the high level "H", the NAND circuit G3 outputs the output signal OUTPS of the low level "L" to the outside. Otherwise, the NAND circuit G3 outputs the output signal OUTPS of the high level "H" to the outside. The NAND circuit G4 is supplied with the output signal OUTPS, the signal SF2, and the coincidence detection signal MTOUTB from the coincidence detecting circuit A9. When all of the output signal OUTPS, the signal SF2, and the coincidence detection signal MTOUTB are in the high level "H", the NAND circuit G4 outputs the reset signal DRST of the low level "L". Otherwise, the NAND circuit G4 outputs the reset signal DRST of the high level "H". The CMOS transfer gate circuit G5 is supplied with the bus signal HT<0> from the delay circuit A7 and an output signal MCNTS, which is an inversion signal of the bus signal HT<0> from the delay circuit A7, and the sources of the NMOS transistor and PMOS transistor thereof are grounded (GND). When the signal levels of the bus signal HT<0> and the output signal MCNTS are in the high level "H" and the low level "L", respectively, the CMOS transfer gate circuit G5 outputs the output signal MDLYI of the low level "L". The CMOS transfer gate circuit G6 is supplied with the output signal MCNTS from the delay circuit A7 and the bus signal HT<0> from the delay circuit A7, and the input is supplied with the output signal OUTPS. When the signal levels of the bus signal HT<0> and the output signal MCNTS are the low level "L" and the high level "H", respectively, the CMOS transfer gate circuit G6 outputs the output signal MDLYI.

The delay circuit A7 in the delay section S1 includes a delay circuit H1 having the same structure as the delay circuit A2 in the reference delay section S0. That is, the delay circuit H1 is supplied with the bus signal CNT<3:0> outputted from the counter circuit A4. The delay circuit H1 is supplied with the output signal MDLYI from the delay circuit control circuit A6 as the output signal DLYI. The delay circuit H1 is supplied with the reset signal DRST from the delay circuit control circuit A6 as the reset signal RST. The delay circuit H1 outputs the output signal MCNTS as the output signal DLYOB, and the bus signal HT<0> as the output signal DLYO.

The delay counter circuit A8 in the delay section S1 includes flip-flop circuits I1, I2, and I3. Each of the flip-flop circuits I1, I2, and I3 has a data input terminal DB, a clock input terminal CK, output terminals Q and QB, and a reset terminal RST. The input terminal DB and the output terminal Q are connected. The terminal CK of the flip-flop circuit I1 is connected to the delay circuit A7. The output terminals QB of the flip-flop circuits I1 and I2 are connected to the terminals CK of the flip-flop circuits I2 and I3, respectively. The terminal CK of the flip-flop circuit I1 is supplied with the output signal MCNTS from the delay circuit A7. When the signal level of the above output signal MCNTS shifts to the high level "H", the flip-flop circuit I1 outputs a signal in phase with a signal DB supplied to the input terminal DB to the output terminal QB as a signal SF6. When the signal level of the above signal SF6 shifts to the high level "H", the flip-flop circuit I1 latches the DB data supplied to the input terminal DB, and outputs as the bus signal HT<1> to the output terminal Q. The terminal CK of the flip-flop circuit I2 is supplied with the signal SF6 from the flip-flop circuit I1. When the signal level of the above signal SF6 shifts to the high level "H", the flip-flop circuit I2 outputs a signal in phase with the signal DB supplied to the input terminal DB to the output terminal QB as a signal SF7. When the signal level of the above signal SF7 shifts to the high level "H", the flip-flop circuit I2 latches the signal DB supplied to the input terminal DB, and outputs a bus signal HT<2> to the output terminal Q. The terminal CK of the flip-flop circuit I3 is supplied with the output signal SF7 from the flip-flop circuit I2. When the signal level of the above output signal SF7 shifts to the high level "H", the flip-flop circuit I3 latches the DB data supplied to the input terminal DB, and outputs a bus signal HT<3> to the output terminal Q. The flip-flop circuits I1, I2, and I3 reset the outputs of the output terminal Q and QB when the reset terminals RST of the flip-flop circuits I1, I2, and I3 receive the above reset signal DRST.

The coincidence detecting circuit A9 in the delay section S1 includes exclusive NOR circuits J1, J2, J3, and J4, and a NAND circuit J5. The exclusive NOR circuit J1 is supplied with a set bus signal MT<0> of a set bus signal MT<3:0>, and the bus signal HT<0>. When the set bus signal MT<0> and the bus signal HT<0> are coincident with each other, the exclusive NOR circuit J1 outputs a signal XT0 of the high level "H". Otherwise, the exclusive NOR circuit J1 outputs the signal XT0 of the low level "L". The exclusive NOR circuit J2 is supplied with a set bus signal MT<1> of the set bus signal MT<3:0>, and the bus signal HT<1>. When the signal levels of the set bus signal MT<1> and the bus signal HT<1> are coincident with each other, the exclusive NOR circuit J2 outputs a signal XT1 of the high level "H". Otherwise, the exclusive NOR circuit J2 outputs the signal XT1 of the low level "L". The exclusive NOR circuit J3 is supplied with a set bus signal MT<2> of the set bus signal MT<3:0>, and the bus signal HT<2>. When the signal levels of the set bus signal MT<2> and the bus signal HT<2> are coincident with each other, the exclusive NOR circuit J3 outputs a signal XT2 of the high level "H". Otherwise, the exclusive NOR circuit J3 outputs the signal XT2 of the low level "L". The exclusive NOR circuit J4 is supplied with a set bus signal MT<3> among the set bus signal MT<3:0>, and the bus signal HT<3>. When the signal levels of the set bus signal MT<3> and the bus signal HT<3> are coincident with each other, the exclusive NOR circuit J4 outputs a signal XT3 of the high level "H". Otherwise, the exclusive NOR circuit J4 outputs the signal XT3 of the low level "L". The NAND circuit J5 is supplied with the signals XT0, XT1, XT2, and XT3. When all of the signals XT0, XT1, XT2, and XT3 are in the high level "H", the NAND circuit J5 outputs the coincidence detection signal MTOUTB of the low level "L" to the delay circuit control circuit A6. Otherwise, the NAND circuit J5 outputs the coincidence detection signal MTOUTB of the high level "H" to the delay circuit control circuit A6.

Next, an operation of the semiconductor memory device according to the first embodiment of the present invention will be described with reference to FIGS. 4A to 4K and FIGS. 5A to 5G. FIGS. 4A to 4K are timing charts showing an operation of the reference delay section S0.

Figure 4A:
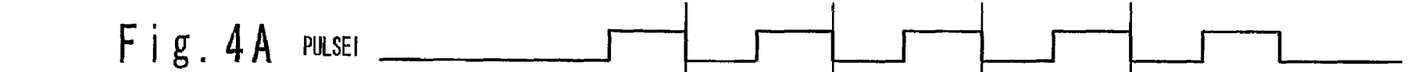
Figure 4B:
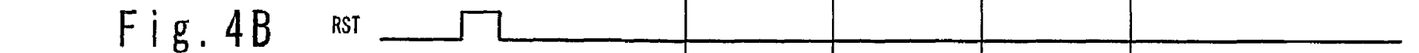
Figure 4C:
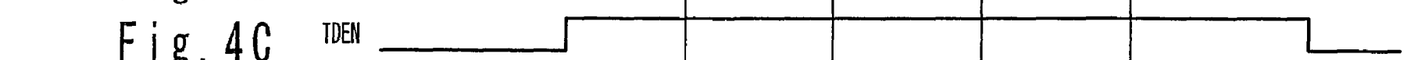
Figure 4D:
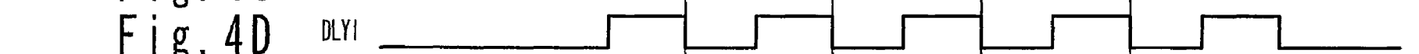
Figure 4E:
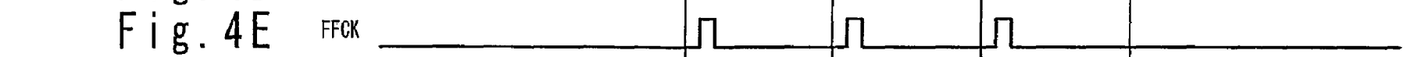
Figure 4F:
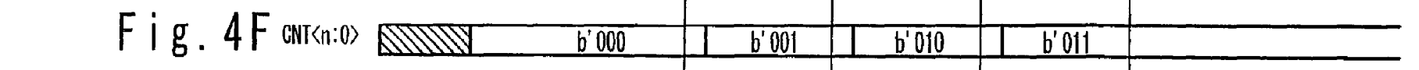
Figure 4G:
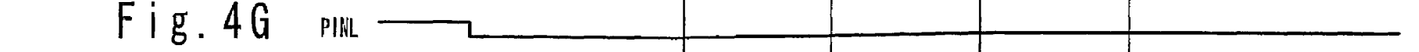
Figure 4H:
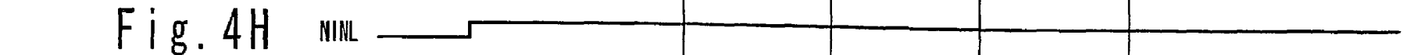
Figure 4I:
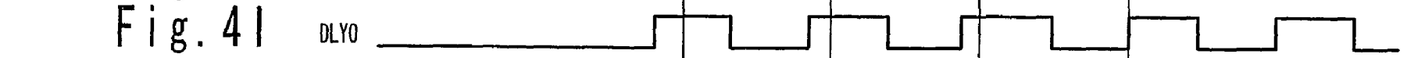
Figure 4J:
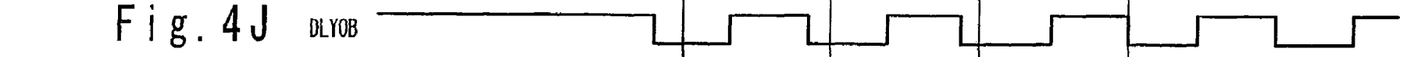
Figure 4K:
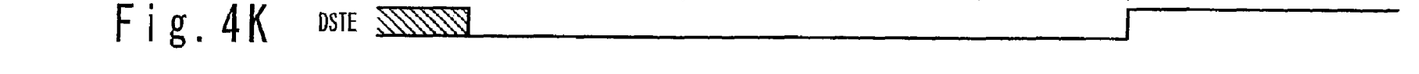

First, as an initialization operation, the reset signal RST of the high level is supplied as a one-shot pulse to the delay circuit A2, the determining circuit A3, and the counter circuit A4, to perform reset in the delay circuit A2, the determining circuit A3, and the counter circuit A4. Through the above reset operation, the delay circuit A2 outputs the output signal DLYOB of the high level "H"; the determining circuit A3 outputs the determination resultant signal DSTE of the low level "L"; and the counter circuit A4 outputs the bus signal CNT<n:0> of the low level "L".

When the bus signal CNT<n:0> of the low level "L" is supplied from the counter circuit A4 to the delay circuit A2, the signals supplied to the gates of the PMOS transistors C5 to C8 become the high level "H", and the signals supplied to the gates of the NMOS transistors C9 to C12 become the low level "L" in the delay circuit A2. At this time, the signal PINL used to determine a delay in the delay circuit A2 gets the low level, and drive performance of the PMOS transistor C18 is increased. Additionally, the signal NINL gets the high level, and drive performance of the NMOS transistor S23 is increased. Consequently, a time period for which the delay circuit A2 receives the output signal DLYI from the delay circuit pulse generating circuit A1 to output the output signals DLYO and DLYOB, namely, a delay time of the delay circuit A2 is minimized.

Next, the enable signal TDEN generated through the external command is set to the high level "H" and supplied to the delay circuit pulse generating circuit A1, the determining circuit A3, and the counter circuit control pulse signal generating circuit A5. After that, the pulse signal PULSEI is supplied from the high-performance tester and so on (not shown) to the semiconductor memory device and is delivered to the delay circuit pulse generating circuit A1, the determining circuit A3, and the counter circuit control pulse signal generating circuit A5. The pulse width of the pulse signal PULSEI in the high level "H", indicates a set delay value, which is a delay value to be set to the delay circuit A2. Here, in an initialization state, the pulse width of the pulse signal PULSEI is set to a value larger than a delay value in the initialization state. That is, the adjustment range of the delay circuit A2 needs to be set so as to permit adjustment to a desired delay value in a range between the expected fastest and slowest delay values, a difference between which is caused due to the diffusion conditions and the in-plane variations of a wafer, and so on.

The delay circuit pulse generating circuit A1 outputs the output signal DLYI in phase with the pulse signal PULSEI to the delay circuit A2 in response to the pulse signal PULSEI and the enable signal TDEN. The delay circuit A2 delays the output signal DLYI with a certain delay value, and outputs the delayed output signal DLYI as the output signals DLYO and DLYOB. The determining circuit A3 latches the output signal DLYOB in response to the falling edge of the pulse signal PULSEI.

Since the signal level of the output signal DLYI and that of the output signal DLYOB are not coincident with each other during the first stage, the determining circuit A3 outputs the determination resultant signal DSTE of the low level "L". When the determination resultant signal DSTE is in the low level "L", the adjustment of the delay is not completed. In this case, the counter circuit control pulse generating circuit A5 takes an operation state, and outputs the control pulse signal FFCK of the high level "H" as a one-shot pulse after a delay by an internal buffer circuit and so on, in response to the falling edge of the pulse signal PULSEI at a time T1.

The counter circuit A4 receives the control pulse signal FFCK to control the flip-flops in the counter circuit A4 operate, and outputs the bus signal CNT<0> of the high level "H". When the bus signal CNT<0> of the high level "H" is supplied to the delay circuit A2, the signals supplied to the gates of the PMOS transistor C8 and the NMOS transistor C12 shift to the low level "L" and the high level "H" in the delay circuit A2. Because of the transition, the signal level of the signal PINL used to determine the delay in the delay circuit A2 is slightly increased, and the signal level of the signal NINL is slightly decreased. As a result, the delay time for which the delay circuit A2 receives the output signal DLYI from the delay circuit pulse generating circuit A1 to output the output signals DLYO and DLYOB is slightly extended. The setting of a step time of the above delay time is performed by adjusting the drive performance of the PMOS transistors C5 to C8 and the NMOS transistors C9 to C12 in the delay circuit A2 in advance. The above transition is performed in a time period from the time T1 showing the first falling edge of pulse signal PULSEI to a time showing the next (second) falling edge of the pulse signal PULSEI.

Similarly, the above transition is performed a time period from a time T2 showing the second falling edge of the pulse signal PULSEI to a time showing the third rising edge of the pulse signal PULSEI. Next, the transition is performed in a time period from a time T3 showing the third falling edge of the pulse signal PULSEI to a time showing the fourth rising edge of the pulse signal PULSEI. Then, the transition is performed in a time period from a time T4 showing the fourth falling edge of the pulse signal PULSEI to a time showing the fifth rising edge of the pulse signal PULSEI. Thus, by repeating the above transition, the delay value of the delay circuit A2 gets gradually closer to the pulse width "H" of the pulse signal PULSEI supplied to the delay circuit A2. At the time T4, the delay value of the delay circuit A2 is the same value as the delay value shown by the pulse signal PULSEI.

At this time, the determining circuit A3 latches the output signal DLYOB of the high level "H" from the delay circuit A2, and outputs the determination resultant signal DSTE of the high level "H". That is, the determining circuit A3 outputs the determination resultant signal DSTE of the high level "H", when determining that the output signal DLYOB from the delay circuit A2 is in the high level "H" in response to the falling edge of the pulse signal PULSEI when the enable signal TDEN is in the high level "H". In this case, the counter circuit control pulse signal generating circuit A5 does not output the control pulse signal FFCK of the high level "H" as a one-shot pulse. Therefore, the counter circuit A4 stops the operation.

Through the above operation, a value of the CNT<3:0> is settled (fixed, set) as a reference delay of the delay circuit A2. The settled (fixed, set) delay value of the delay circuit A2 is hereinafter referred to as a reference delay value. After that, the signal level of the enable signal TDEN is changed to the low level "L" through the external command.

FIGS. 5A to 5G are timing charts showing an operation of the delay section S1. As shown in FIGS. 5A to 5G, the operation of the delay section S1 will be described when the bus signal CNT<n:0> as a delay data is b'011 in the binary, and the set bus signal MT<m:0> is b'100 in the binary to indicate how many times of the delay value of the delay circuit A2 is necessary.

Figures 5A, 5B, 5C:
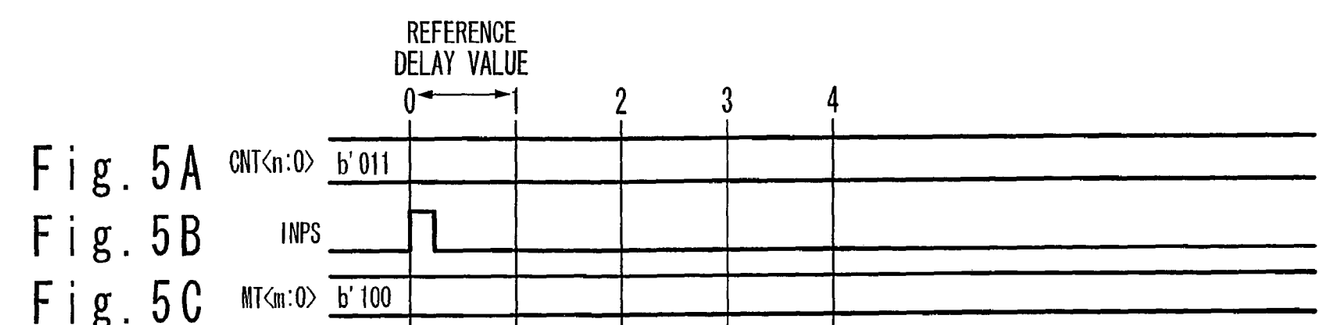
Figure 5D:
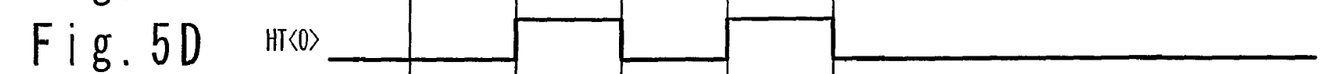
Figure 5E:
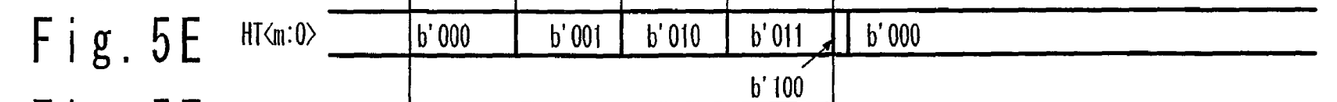
Figures 5F, 5G:
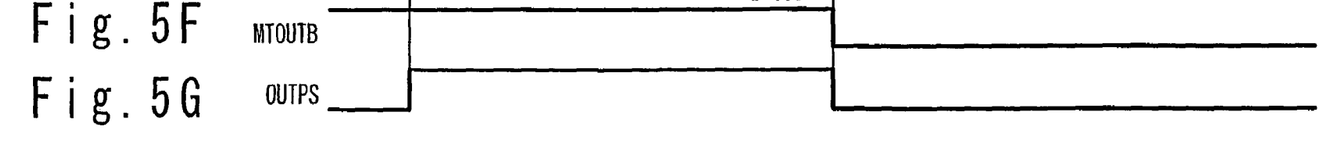

First, as the initialization operation, the reset signal RST of the high level as a one-shot pulse is supplied to the delay circuit control circuit A6. At this time, the delay circuit control circuit A6 receives the reset signal RST to supply the reset signal DRST to the delay circuit A7 and the delay counter circuit A8, for resetting the delay counter circuit A8. Through the above reset operation, the delay circuit A7 outputs the bus signal HT<0> of the low level "L" as the output signal DLYO of the delay circuit A7, and outputs the output signal MCNTS of the high level "H" as the output signal DLYOB of the delay circuit A7.

Here, the signal level of the reset signal DRST is latched by the NAND circuits G3 and G4 of the delay circuit control circuit A6 and outputted as the signal of the high level "H". That is, the delay circuit A7 stops operation. Additionally, the delay counter circuit A8 is also in a reset state. Therefore, the signal level of the bus signal HT<m:0> is the low level "L". At this time, since the value indicated by the bus signal HT<2> and the value indicated by the set bus signal MT<2> are different, the coincidence detecting circuit A9 sets the signal level of the signal XT2 outputted from the exclusive NOR circuit J3 to the low level "L", and the signal level of the coincidence detection signal MTOUTB outputted from the NNAD circuit J5 to the high level "H". In this state, if the trigger signal INPS of the high level as the one-shot pulse is supplied to the delay circuit control circuit A6, the trigger signal INPS of the high level "H" is latched by the NAND circuits G3 and G4 of the delay circuit control circuit A6, so that the signal level of the output signal OUTPS is set to the high level "H", and the signal level of the reset signal DRST is set to the low level "L". That is, the delay circuit A7 enters an operation permitting state.

Since the signal level of the bus signal HT<0> is the low level "L" and the signal level of the output signal MCNTS is the high level "H", the CMOS transfer gate circuit G6 outputs the output signal OUPTS of the high level "H" as the output signal MDLYI. The output signal MDLYI is supplied to the delay circuit A7 as the signal DLYI. The delay circuit A7 recognizes the delay value (reference delay value) of the delay circuit A2 in the above reference delay section S0 from the bus signal CNT<3:0> from the counter circuit A4 in the above reference delay section S0. The delay circuit A7 delays the output signal MDLYI of the high level "H" with the same delay value as the reference delay value, and sets the signal level of the bus signal HT<0> to the high level "H" as the output signal DLYO of the delay circuit A7, and the signal level of the output signal MCNTS to the low level "L" as the output signal DLYOB of the delay circuit A7. In response to the transition of the bus signal HT<0> to the high level "H" and the output signal MCNTS to the low level "L", the CMOS transfer gate circuit G6 of the delay circuit control circuit A6 takes an OFF state. Instead, the COMS transfer G5 takes an ON state. Thus, the delay circuit control circuit A6 sets the signal level of the output signal MDLYI to the low level "L" as the GND level. The delay circuit A7, after delaying the output signal MDLYI of the low level "L" with the reference delay value, sets the signal level of the bus signal HT<0> to the low level "L", and the signal level of the output signal MCNTS to the high level "H". The transition of the signal level of the output signal MCNTS to the high level "H" starts the flip-flop circuit I1 of the delay counter circuit A8, so that the signal level of the bus signal HT<1> is set to the high level "H". In response to the transitions of the bus signal HT<0> to the low level "L" and the output signal MCNTS to the high level "H", the CMOS transfer gate circuit G5 of the delay circuit control circuit A6 takes the OFF state, and the CMOS transfer gate circuit G6 takes the ON state. Thus, the CMOS transfer gate circuit G6 of the delay circuit control circuit A6 outputs the output signal OUTPS of the high level "H" as the output signal MDLYI. The output signal MDLYI is supplied to the delay circuit A7 as the signal DLYI.

By repeating the above operation, the delay counter circuit A8 counts up for every delay value of two times of the reference delay value. The signal level of the bus signal HT<0> as the output of the delay circuit A7 is switched from the low level "L" to the high level "H" to the low level "L" in units of the reference delay values. This is the same as change of a least significant bit of a count value that indicates the number of times of the delay based on the reference delay value. The bus signals HT<0> as the output of the delay circuit A7 and HT<m:1> as the output of the counter circuit indicate a multiplication of the reference delay value by a constant.

As shown in FIGS. 5A to 5G, the value shown by the bus signal HT<m:0> is the same as b'100 shown by the set bus signal MT<m:0>. That is, the value shown by the bus signal HT<2> and the value shown by the set bus signal MT<2> are the same. At this time, the coincidence detecting circuit A9 sets the signal levels of the signals XT0, XT1, XT2, and XT3 outputted from the exclusive NOR circuits J1, J2, J3, and J4 to the high level H", and sets the signal level of the coincidence detection signal MTOUTB to the low level "L" as the detection resultant signal outputted from the NAND circuit J5. In this state, if the coincidence detection signal MTOUTB of the low level "L" is supplied to the delay circuit control circuit A6, the signal level latched by the NAND circuits G3 and G4 of the delay circuit control circuit A6 is reset. Also, the signal level of the output signal OUTPS is set to the low level "L", and the signal level of the reset signal DRST is set to the high level "H". That is, the same state as the initialization state is generated.

Through the above operation, it is possible to generate the output signal OUTPS of the high level "H" for a time period corresponding to the multiplication of the reference delay value by a value shown by the set bus signal MT<m:0>.

In the example shown in FIG. 5, it is possible to generate the output signal OUTPS having a pulse width of four times of the reference delay value. By using the above transition, a desired operation can be performed after a requested delay time.

As described above, the semiconductor memory device of the present invention can eliminate a difference between the delay value of the delay circuit at the time of designing and the delay value of the actual delay circuit through the use of the above reference delay section S0, even when the delay value of the actual delay circuit is different from the delay value of the delay circuit at the time of designing due to diffusion conditions and in-plane variations of a wafer and so on, at the time of manufacturing the semiconductor memory device. That is to say, in the reference delay section S0, the delay circuit pulse generating circuit A1 outputs the output signal DLYI in the active state to the delay circuit A2, when the pulse signal PULEI is in the active state "H" when the delay circuit pulse generating circuit A1 receives the enable signal TDEN.

The determining circuit A3 outputs the comparison result DSTE to indicate the non-coincidence between the second delay value and the set delay value, when the pulse width showing the active state "H" of the pulse signal PULSEI and the pulse width showing the active state "H" of the signal DLYOB are not coincident with each other. At this time, the counter circuit control pulse signal generating circuit A5 outputs the control pulse signal FFCK in the active state "H". Also, the counter circuit A4 increments a retained adjustment value by one, and outputs the bus signal CNT<n:0> to indicate the incremented adjustment value. Additionally, the delay circuit A2 generates the second delay value based on the first delay value and the adjustment value shown by the bus signal CNT<n:0>, and delays the output signal DLYI with the second delay value to output the output signal DLYOB.

On the other hand, the determining circuit A3 outputs the comparison result DSTE to indicate the coincidence between the second delay value and the set delay value, when the pulse width showing the active state "H" of the pulse signal PULEI and the pulse width showing the active state "H" of the signal DLYOB are coincident with each other. At this time, the counter circuit control pulse signal generating circuit A5 outputs the control pulse signal FFCK in the inactive state "L" in order to fix the adjustment value shown by the bus signal CNT<n:0> outputted from the counter circuit A4. The counter circuit A4 regards the retained adjustment value as the fixed value, and outputs the bus signal CNT<n:0> to indicate the retained adjustment value. In this case, the delay circuit A2 generates the reference delay value based on the first delay value and the above fixed adjustment value indicated by the bus signal CNT<n:0>, and delays the output signal DLYI with the reference delay value to output the output signal DLYOB. Thus, in the semiconductor memory device of the present invention, since the reference delay value is generated by using the above reference delay section S0, it is possible to eliminate the difference between the delay value of the delay circuit at the time of designing and the delay value of the actual delay circuit. Also, in the semiconductor memory device of the present invention, since the reference delay value is generated by using the above reference delay section S0, it is possible to obtain the delay value of m times of the reference delay value as a desired delay value through the use of the delay section S1.

That is, in the delay section S1, the delay circuit A7 having the same configuration as the delay circuit A2 generates the reference delay value based on the first delay value and the above fixed adjustment value indicated by the bus signal CNT<n:0>, and delays the output signal MDLYI with the reference delay value to output the signal MCNTS as the output signal DLYOB, and the bus signal HT<0> as an inversion signal of the output signal DLYOB. The latch sections G3 and G4 of the delay circuit control circuit A6 latches the output signal OUTPS in response to the trigger signal INPS. When the output signal OUTPS is latched and the bus signal HT<0> is in one of the active state "H" and the inactive state "L", the delay circuit control circuit A6 outputs the output signal MDLYI in the other state of the active state "H" and the inactive state "L" to the delay circuit A7. When the output signal MCNTS changes from one state of the active state "H" and the inactive state "L" to the other state, the delay counter circuit A8 increments the retained output count value HT<m:1> by one, and outputs the bus signal HT<m:1> to indicate the incremented output count value. The coincidence detecting circuit A9 receives the bus signal HT<0> from the delay circuit A7 and the bus signal HT<m:1> from the delay counter circuit A8, and is supplied with the set bus signal MT<m:0> indicating a set multiplication value, which is a delay value of m times of the reference delay value. When the output count value indicated by the bus signal HT<m:0> and the set multiplication value indicated by the set bus signal MT<m:0> are coincident with each other, the coincidence detecting circuit A9 outputs the coincidence detection signal MTOUTB to the delay circuit control circuit A6. At this time, the delay circuit control circuit A6 outputs the output signal OUTPS latched by the latch sections G3 and G4 in response to the coincidence detection signal MTOUTB.

In this way, in the semiconductor memory device of the present invention, it is possible to obtain a delay value of m times of the reference delay value as a desired delay value through the use of the delay section S1.

Second Embodiment

Figure 6:
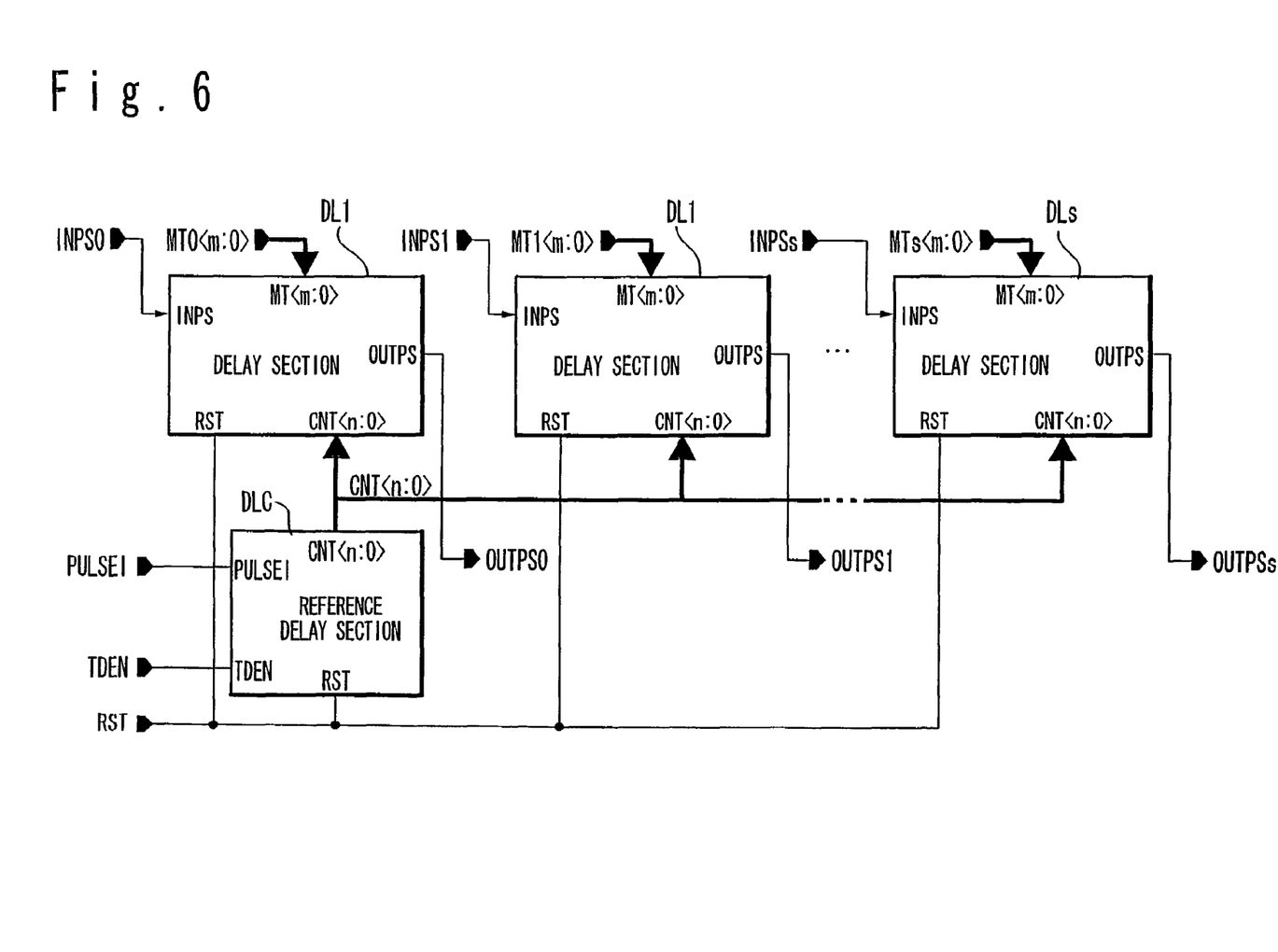
FIG. 6 is a block diagram showing the configuration of the semiconductor memory device according to a second embodiment of the present invention.
Figures 7A, 7B:
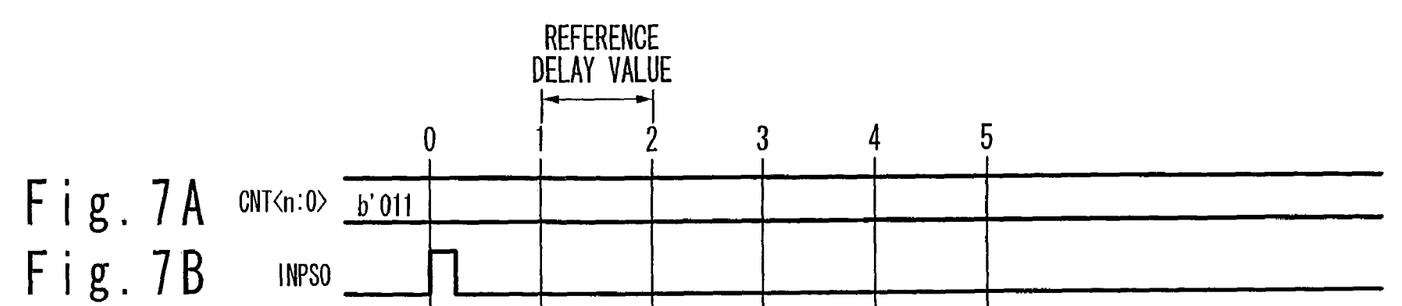
Figures 7C, 7D:
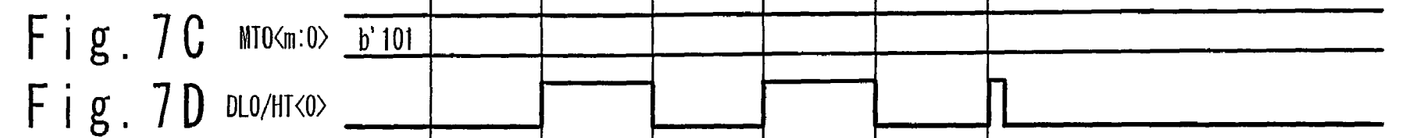
Figure 7E:
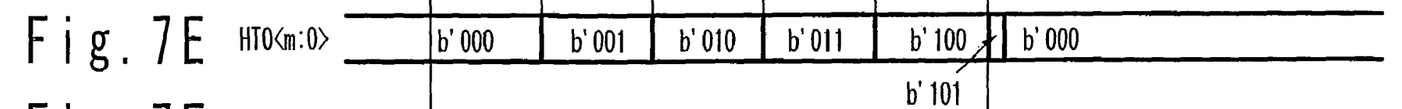
Figure 7F:
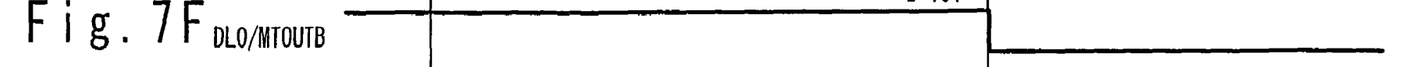
Figure 7G:
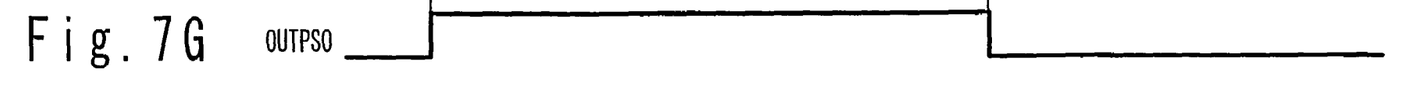
Figure 8A:
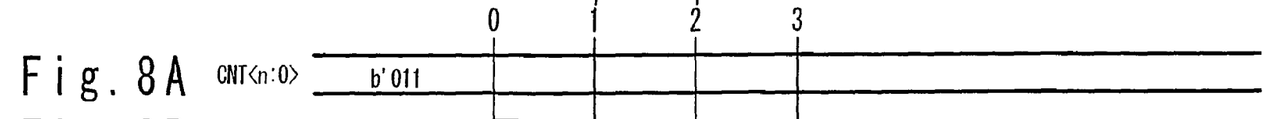
Figures 8B, 8C:
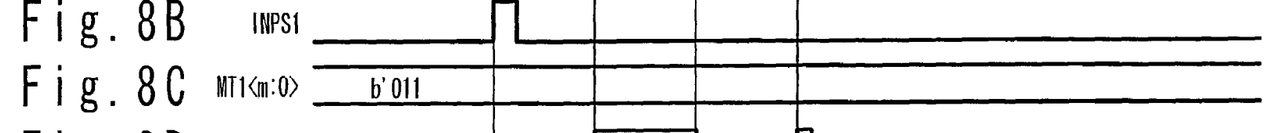
Figure 8D:
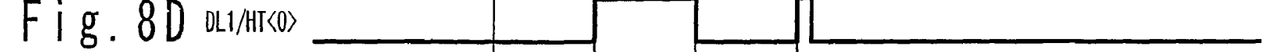
Figures 8E, 8F:
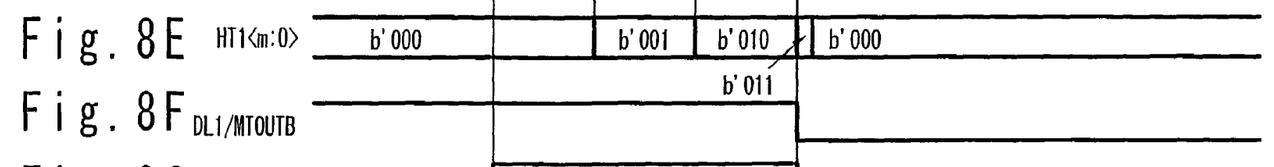
Figure 8G:
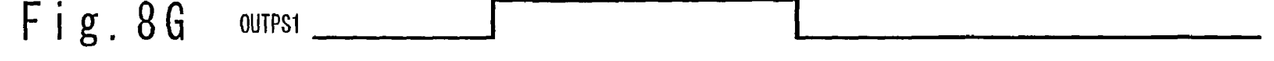
Figure 9A:
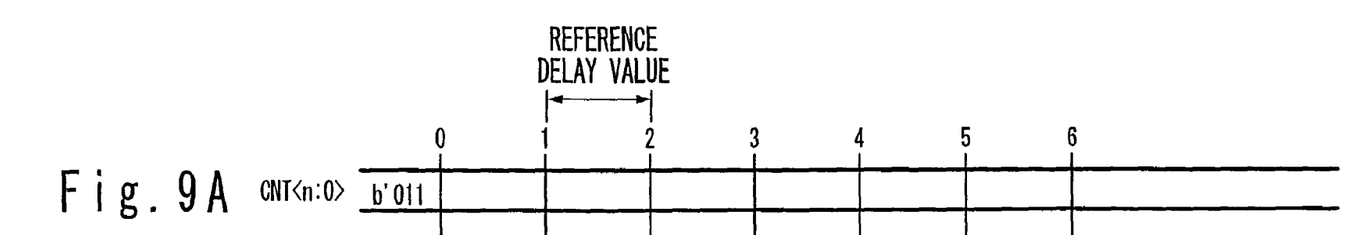
Figure 9B:
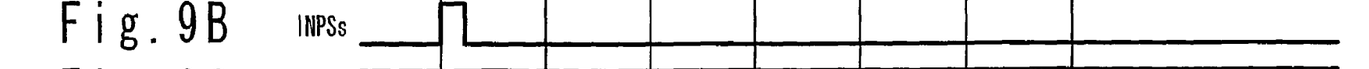
Figure 9C:
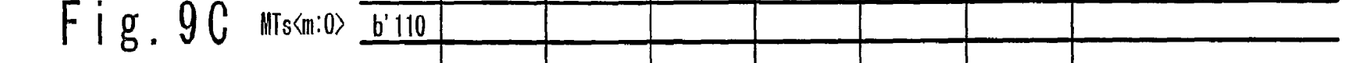
Figures 9D, 9E:
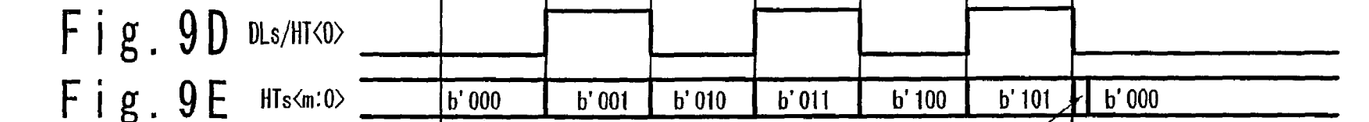
Figure 9F:
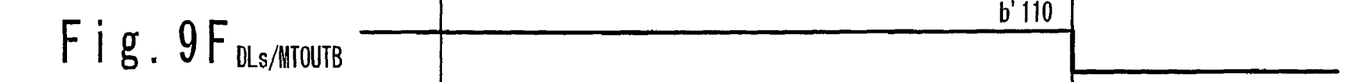
Figure 9G:
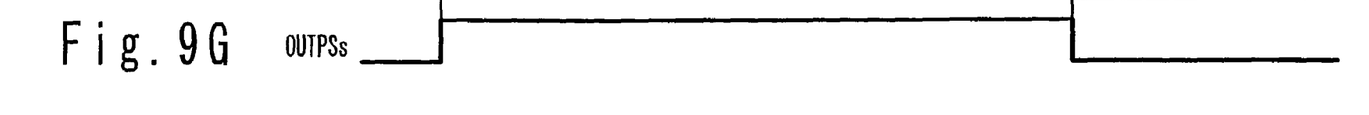

FIG. 6 is a block diagram showing a configuration of the semiconductor memory device according to the second embodiment of the present invention. In the second embodiment, the same description as the first embodiment is omitted.

The semiconductor memory device in the second embodiment has a reference delay circuit DLC corresponding to the reference delay section S0 in the first embodiment, and delay sections DL0, DL1, . . . , and DLs corresponding to the delay section S1 in the first embodiment. Here, "s" of the DLs shows the number of delay circuits requiring the reference delay value.

As in the reference delay section S0 in the first embodiment, the reference delay section DLC receives the pulse signal PULSEI, the enable signal TDEN, and the reset signal RST, and outputs the bus signal CNT<n:0> to the delay sections DL0, DL1, . . . , and DLs. As in the delay section S1 in the first embodiment, the delay sections DL0, Dl1, . . . , and DLs respectively receive trigger signals INPS0, INPS1, and INPSs as the above trigger signals, and MT1<m:0> . . . , and MTs<m:0> as the set bus signals, and receive the reset signal RST, the bus signal CNT<n:0>, and set bus signal MT0<m:0> in common. The delay section DL0, Dl1, . . . , and DLs output output signals OUTPS0, OTUPS1, . . . , and OUTPSs as the output signals OUTPS, respectively.

The configuration of the reference delay section DLC is the same as that of the reference delay section S0 in the first embodiment. For this reason, components of the reference delay section DLC are referred to as DLC/A1 to A4, and signals inputted and outputted to and from the components used only in the reference delay section DLC are referred to as DLC/"signal name". The configuration of each of the delay sections DL0, DL1, . . . , and DLs is the same as that of the delay section S1 in the first embodiment. For this reason, names of components of the delay sections DL0, Dl1, . . . , and DLs are referred to as DL0/A6 to A9, DL1/A6 to A9, . . . , and DLs/A6 to A9, respectively. Signals inputted and outputted to and from the components used only in the delay sections DL0, DL1, . . . , and DLs are referred to as DL0/"signal name", DL1/"signal name", . . . , and DLs/"signal name", respectively.

Next, an operation of the semiconductor memory device according to the second embodiment of the present invention will be described with reference to FIGS. 7A to 7G, FIGS. 8a to 8G, and FIGS. 9A to 9G. Description is omitted on an operation of the reference delay section DLC, which is the same as that of the reference delay section S0 (see FIG. 4). In this case, the bus signal CNT<n:0> is fixed after generation of the reference delay value.

FIGS. 7A to 7G are timing charts showing the operation of the delay section DL0. As shown in FIGS. 7A to 7G, the operation of the delay section DL0 will be described when the bus signal CNT<n:0> is "b'011" in the binary and the set bus signal MT0<m:0> is "b'101" in the binary. In this case, a value shown by the bus signal HT<m:0> is the same as b'100 shown by the set bus signal MT0<m:0>, as shown in FIGS. 7A to 7G.

Through the above operation, it is possible to generate the output signal OUTPS having the pulse width of the high level "H" as a delay value, which is obtained by multiplying the reference delay value by a multiplication value indicated by the set bus signal MT0<m:0>. In the example shown in FIGS. 7A to 7G, it is possible to generate the output signal OUTPS having as the pulse width, a delay time of five times of the reference delay value.

FIGS. 8A to 8G are timing charts showing the operation of the delay section DL1. As shown in FIGS. 8A to 8G, the operation of the delay section DL1 will be described when the bus signal NCT<n:0> is "b'011" in the binary, and the set bus signal MT1<m:0> is "b'011" in the binary. In this case, a value shown by the bus signal HT<m:0> is the same as b'100 shown by the set bus signal MT1<m:0>, as shown in FIGS. 8A to 8G.

Through the above operation, it is possible to generate the output signal OUTPS having the pulse width of the high level "H" as a delay value, which is obtained by multiplying the reference delay value by a multiplication value indicated by the set bus signal MT1<m:0>. In the example shown in FIGS. 8A to 8G, it is possible to generate the output signal OUTPS having as the delay time, the pulse width of three times of the reference delay value.

FIGS. 9A to 9G are timing charts showing the operation of the delay section DLs. Referring to FIGS. 9A to 9G, the operation of the delay section DLs will be described when the above bus signal CNT<n:0> is "b'011" in the binary, and the set bus signal MTs<m:0> is "b'110" in the binary. In this case, a value indicated by the bus signal HT<m:0> is the same as b'110 indicated by the set bus signal MTs<m:0>, as shown in FIGS. 9A to 9G.

Through the above operation, it is possible to generate the output signal OUTPS having the pulse width of the high level "H" as a delay value, which is obtained by multiplying the reference delay value by a multiplication value indicated by the set bus signal MTs<m:0>. In the example shown in FIGS. 9A to 9G, it is possible to generate the output signal OUTPS having as a delay time, the pulse width of six times of the reference delay value.

In this way, in the semiconductor memory device of the present invention, the set multiplication values indicated by the set bus signals MT0<m:0>, Mt1<m:0>, ..., and MTs<m:0> in the plurality of delay sections DL0, DL1, ..., and DLs may be different from each other.

It should be noted that the semiconductor memory device of the present invention is not limited to the above circuit configuration. For example, the counter circuit A4 in the reference delay circuit S0 may include a fuse circuit.

As described above, the semiconductor memory device of the present invention can eliminate the difference between the delay value of the delay circuit at the time of designing and the delay value of the actual delay circuit.

Also, the present invention is applicable to semiconductor memory devices such as a DRAM, an SRAM, and so on.

The invention claimed is:

1. A semiconductor device comprises:
a reference delay section having a first delay value and configured to delay a first signal by a reference delay value obtained from said first delay value and an adjustment value while changing said adjustment value, and to fix said adjustment value when said first signal and the delayed first signal meet a predetermined condition; and
a delay section having a second delay value, and configured to generate an output signal based on a summation of the fixed adjustment value and said second delay value, and a set multiplication value in response to a trigger signal such that said output signal in an active state for a period corresponding to said set multiplication value.

2. The semiconductor device according to claim 1, wherein said predetermined condition is coincidence of a phase of said first signal and a phase of said delayed first signal.

3. The semiconductor device according to claim 1, wherein said reference delay section comprises:
a control pulse signal generating circuit configured to generate a clock pulse signal when said first signal and the delayed first signal do not meet said predetermined condition; and
a counter circuit configured to count said clock pulse signal to change said adjustment value.

4. The semiconductor device according to claim 3, wherein said control pulse signal generating circuit stops the generation of said clock pulse signal when said first signal and the delayed first signal meet said predetermined condition, and said counter circuit holds and fixes said adjustment value when said clock pulse signal is not supplied from said control pulse signal generating circuit.

5. The semiconductor device according to claim 1, wherein said second delay value is same as said first delay value.

6. The semiconductor device according to claim 1, wherein said delay section comprises:
a control circuit configured to hold said output signal to said active state in response to said trigger signal, and to reset said output signal to an inactive state when the summation of the fixed adjustment value and said second delay value is equal to said set multiplication value.

7. The semiconductor device according to claim 6, wherein said delay section comprises:
a delay circuit configured to delay said output signal by the summation of the fixed adjustment value and said second delay value;
a delay counter configured to count a number of times of the delay by said delay circuit; and
a coincidence detection circuit configured to generate a coincidence signal when detecting coincidence of a count value of said delay counter and said set multiplication value, and
said control circuit resets said output signal to the inactive state in response to said coincidence signal.

8. The semiconductor device according to claim 1, further comprising:
a plurality of said delay sections,
wherein said reference delay section outputs the fixed adjustment value to said plurality of delay sections, and said plurality of delay sections receives a plurality of said set multiplication values which are different from each other.

* * * * *